July 13, 1965 A. T. BASSETT, JR 3,194,024

REFRIGERATING APPARATUS

Filed April 29, 1964

INVENTOR.
Arthur T. Bassett, Jr.
BY Carl A. Stickel
His Attorney

United States Patent Office 3,194,024 Patented July 13, 1965

3,194,024
REFRIGERATING APPARATUS

Arthur T. Bassett, Jr., Dayton, Ohio, assignor to General Motors Corporation, Detroit, Mich., a corporation of Delaware Filed Apr. 29, 1964, Ser. No. 363,432
8 Claims. (Cl. 62—3)

This invention pertains to refrigerating apparatus and more particularly to thermoelectric arrays which are structurally strong and economical and especially suitable for transferring heat from one gas to another.

The efficient transfer of heat from one gas to another by thermoelectric devices is a serious problem since it is especially difficult to efficiently transfer heat to and from each small thermoelectric element through large and extensive surfaces to and from the gas or air. The small size and brittleness of the thermoelectric elements make it necessary that means be provided for protecting the elements from physical stress and breakage as far as possible.

It is an object of this invention to provide an efficient thermoelectric arrangement for the efficient direct transfer of heat from one gas to another in which each thermoelectric element is provided with two heat transfer gas contact members which are also used efficiently to conduct electric current in series through the thermoelectric elements.

It is another object of this invention to provide an efficient thermoelectric arrangement for the efficient transfer of heat from one gas to another in which the heat transfer gas contact members are efficiently physically linked to protect the thermoelectric elements from physical stress and breakage and to provide gas ducts for the contact members.

These and other objects are attained in the form shown in the drawings in which the thermoelectric elements are substantially equally spaced in parallel rows with the P & N type elements being arranged alternately. Each of the thermoelectric elements has bonded to its opposite ends a metal conductor rod which passes in a press fit through a perforation in either of two spaced sheets of electrical insulating material located on the metal conductors on opposite sides of the thermoelectric elements. The rods or conductors are provided with transverse stacks of fins each of which are arranged parallel to the sheets to conduct current only between two adjacent conductors. These stacks of fins are arranged so as to conduct the electrical current in series in opposite directions through the thermoelectric elements to segregate the hot and cold junctions without the use of any additional conductors between the thermoelectric elements. The space between the two perforated sheets of electrical insulating material is preferably provided with polyurethane foam which is a strong but light weight electrical and heat insulating material which surrounds all the elements and protects them from physical stress and breakage. In addition, the outer ends of the conductors are reduced and extend through outer electrical insulating sheets which are parallel to the fins and the inner sheets. These outer ends are riveted over the sheets provided on the ends of the conductors to join the ends of the conductors to assure any lateral stress will be shared by the conductors, and particularly to prevent any substantial stress upon the bond between the conductors and the thermoelectric elements as well as stress upon thermoelectric elements themselves. Preferably air is circulated on each side of the thermoelectric elements through ducts formed between sheets of electrical insulating material on each side of the thermoelectric elements parallel to the fins.

Further objects and advantages of the present invention will be apparent from the following description, reference being had to the accompanying drawings wherein a preferred embodiment of the present invention is clearly shown.

Figure 1:
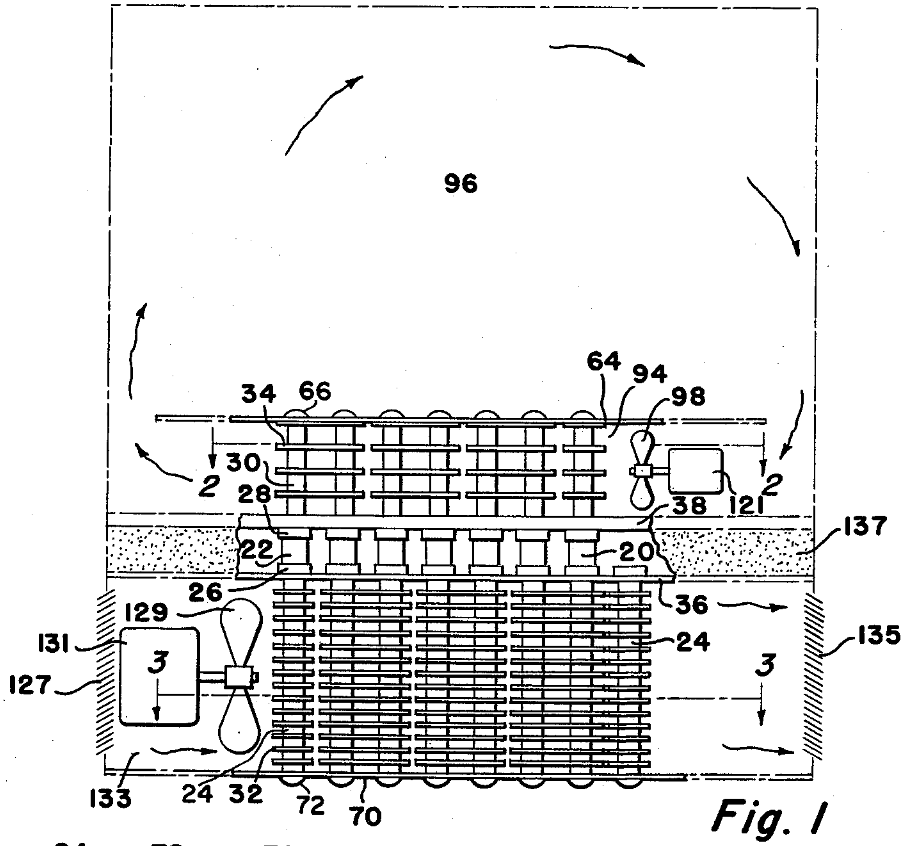
FIGURE 1 is a view in elevation of a thermoelectric array embodying one form of my invention.

Referring now more particularly to the FIGURE 1, there is shown a thermoelectric array incorporating a group of cylindrical thermoelectric elements 20 arranged in four rows of seven elements each. These elements are uniformly spaced apart and are alternated as P & N type elements. In the past there has been difficulty in providing for the efficient transfer of heat from such elements to and from a gas since the gas will change in temperature as it flows in contact with heat transfer elements. Since these elements are normally quite brittle and relatively low strength, they also must be protected from physical stresses which might cause them to be damaged. According to my invention, to take the greatest advantage of the different temperatures of the gas, each of these elements at their opposite ends are provided with a metal conductor providing individual heat transfer between the gas and each thermoelectric element for greater efficiency. For example, bonded to the hot junction face of the element 22 is a metal conductor 24 having a head 26 which may be of the same size or larger than the element 22 bonded to the adjacent face of the element 22 by soldering or other form of bonding. The opposite end or face of the thermoelectric element has bonded to it the head 28 of a metal conductor 30. The metal conductor 24 is made much longer than the metal conductor 30 since the heat to be dissipated from the conductors 24 is several times greater than the heat to be absorbed by the conductors 30. All of the elements in the group 20 are similarly provided with the individual heat conductors 24 and 30 which are in the form of cylindrical copper rods. These heat conductors take full advantage of the temperature of the gas in their immediate vicinity to efficiently transfer the heat from the thermoelectric elements 20 and into and out of the conductors 24 and 30.

The conductors 24 are threaded through a perforated sheet 36 of an electrical insulating plastic having perforations aligned with the thermoelectric elements of a size to fit the conductors 24. The sheet 36 holds the thermoelectric elements 20 and the conductors 24 in the uniform spaced relation in four rows of seven elements each. The fit of the conductors 24 in the perforations of the sheet 36 is sufficiently tight to hold them firmly in place. A second perforated sheet 38 also of electrical and heat insulating material is threaded onto the conductors 30 to provide a firm second support for the elements. The fit of the conductors 30 in the sheet 38 is sufficiently tight to provide a firm support for the elements. It should be noted that the elements 20 are thus protected between the sheets 36 and 38 so as to minimize any physical stress which might be applied to them.

For the purpose of transferring heat to the gas or air more efficiently, the rods 24 are provided with stacks of dual transfer fins 32. Also for the purpose of transferring heat from a gas such as air to the rods 30, the rods 30 are likewise provided with stacks of dual transverse fins 34.

Figure 2:
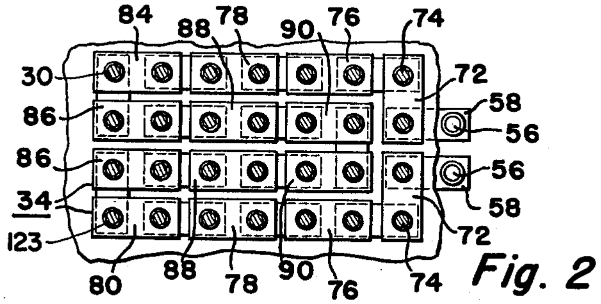
FIGURE 2 is a horizontal sectional view taken along the line 2—2 of FIGURE 1.

According to my invention, the stacks of fins 32 and 34 are arranged in such a way that they not only serve as heat dissipators, but they also serve as the sole electrical connectors to connect the thermoelectric elements 20 in an electrical series circuit arrangement segregating the hot junctions adjacent the sheet 36 and the cold junctions adjacent the sheet 38 so that regardless of whether any thermoelectric element 20 is either the P or the N type, all the heat dissipation from it is applied to its own conductor 24 and all the heat absorption is carried by its own conductor 30. This is done by arranging the stacks of fins 34 in the pattern shown in FIGURE 2, and arranging the stacks of fins 32 in the pattern shown in FIGURE 3. The presence of these fins, in which each only encompasses two of the conductors, holds the conductors firmly in alignment and minimizes the stresses on the thermoelectric elements 20. It should be noted that the stacks of fins 34 are arranged with two stacks 72 at the right end extending transversely across the rows and the remainder, 76 to 90 extending longitudinally arranged in the four longitudinal rows in three transverse rows of stacked fins. The fins 32 are arranged in two transverse stacks 40 and 42 in a transverse row at the left end and have longitudinally extending outer stacks 44, 46 and 48 connecting to the conductors in the outer longitudinal rows while two longitudinal stacks 50 and 52 are provided on the two inner rows. At the opposite ends of the two inner rows is a single transverse stack 54. There is also provided two additional conductors 56 which do not connect to any thermoelectric elements excepting through the two additional longitudinal stacks 56 aligned with the inner rows which connect through the fins 58 to the two inner conductors 60.

Figure 4:
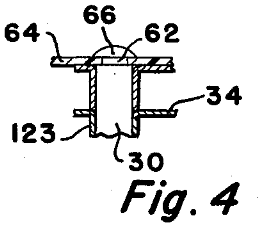
FIGURE 4 is a fragmentary vertical sectional view showing the outer end of one of the conductors connected at the outer end to one of the outer sheets of electrical and heat insulating material.
Figure 5:
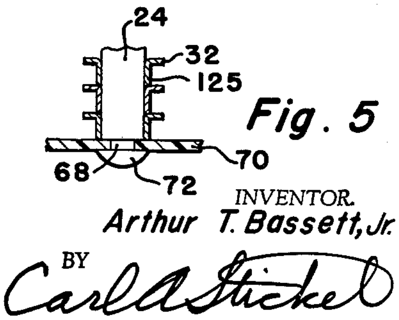
FIGURE 5 is a fragmentary sectional view showing an opposite conductor connected at the outer end to another sheet of electrical and heat insulating material.

To form a duct and to further strengthen the structural aspects of the thermoelectric array as shown in FIGURE 4, each of the conductors 30 is provided with a reduced end portion 62 each of which are press fitted through one of the small apertures in the perforated sheet 64 of electrical conducting material. The reduced diameter outer end portions of these conductors 30 are riveted over to provide the rivet heads 66 which firmly fasten the sheet 64 to the ends of each of the conductors 30 between the shoulder formed by the reduced diameter and the rivet head. This provides additional support and rigidity physically linking all the conductors so as to prevent any stress from being applied to the thermoelectric elements 20. This outer sheet 64 also forms the walls of a duct in cooperation with the inner sheet 38. A similar arrangement illustrated in FIGURE 5 is provided for the conductors 24 each of which have a reduced diameter end portion 68 passing through one of the perforations in the perforated sheet 70 of electrical insulated material. The outer end of the reduced end portion 68 are riveted over to form the rivet head 72 so as to fasten the sheet firmly to the ends of each of the conductors 24 between the shoulder formed by the reduced diameter and the rivet head. The sheet 70 therefore firmly holds the outer ends of the conductors 24 in the same uniformly spaced relation as the sheets 36, 38 and 64 so that these elements are always maintained in an exact spaced parallel relationship so that there will not be any substantial stresses applied to either the thermoelectric elements 20 or their bonds with the conductors 24 and 30. The four perforated sheets 36, 38, 64, 70 of electrical and heat insulating material assure that any stresses applied to any part of the array will be shared by all of the conductors and thermoelectric elements.

The supply conductors may be connected to the conductors 56 which connect through the stack of fins 58 to the conductors 60. The conductors 60 connect through the stack of fins 72 with the conductors 74. The current is then transmitted from the conductors 74 through the stack of fins 48 to the adjacent conductors and thence alternately through the stacks of fins and conductors 76, 46, 78, 44, 80, 42, 40, 86, 50, 88, 52, 90, and 92. Through this arrangement the stacks of fins serve as heat dissipators or absorbers and electrical connections to connect the thermoelectric elements 20 in a series arrangement and also supplement the sharing of any stresses.

As illustrated in FIGURE 1, the perforated sheets 38 and 64 which are perforated only where the conductors 30 pass through, their apertures form a duct 94 through which a gas such as air is drawn from a space 96 to be cooled by the propeller type fan 98 driven by an electric motor 121 which forces the air between the sheets 38 and 64 and the fins 34 to transfer the heat to the fins 34. The fins 34 which are nearest the fan 98 will be the warmest and their temperatures will be progressively lower the further they are from the fan and the incoming air. After passing through the duct 94, the air is returned to the space 96 in a cooled condition. The heat absorbed by the fins 34 is transmitted to the rods 30. The stacks of fins 34 may be provided with integral flanges 123 enveloping the conductors to provide greater heat transfer area between the fins and the conductors 30. Preferably, the fins 34 and particularly their flanges 123 have a sufficiently tight press fit to maintain good conduction with the conductors 30. However, if desired the fins 34 may be bonded to the conductors 30 by soldering or other suitable bonding agents.

Figure 3:
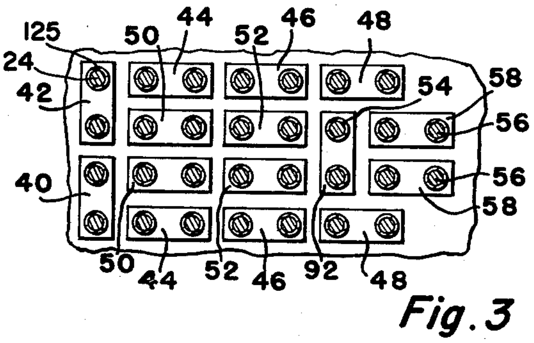
FIGURE 3 is a horizontal sectional view taken along the line 3—3 of FIGURE 1.

The fins shown in FIGURE 3, such as for example the stack of fins 46, may likewise be provided with flanges 125 which fit tightly on the conductor 24 with a press fit which gives good conduction between the fins and the conductors 24 to provide efficient transfer of heat from the conductors 24 to the air. The conductors 24 are cooled by a gas such as air which is drawn in through the louvers 127 by a propeller type fan 129 driven by the electric motor 131. The conductors 24, and associated stacks of fins 32 nearest the fan 129 will be the coolest and their temperatures will be progressively higher the further they are from the fan and the incoming air. The sheets 70 and 36 form a duct 133 between them through which the air is circulated over the stacks of fins 32 to absorb the heat from the conductors 24 before the air is discharged through the discharge louvers 135. The space surrounding the thermoelectric elements 20 between the sheets 36 and 38 is preferably filled with an electrical and heat insulating material 137 such as polyurethane foam. This foam 137 further protects the thermoelectric elements and the bonds with the conductors 30 and 24 so as to protect them from physical stress and damage. The foam also holds the sheets 36 and 38 firmly in place preventing any shear stresses from being applied to the thermoelectric elements 20 and their bonds with the conductors. The foam also serves to insulate the cold air duct 94 from the warm air duct 133 to provide good thermal efficiency from the thermoelectric array.

By providing individual heat absorbing and heat dissipating conductors for each for the thermoelectric elements and by coupling only two adjacent conductors by each stack of fins, maximum advantage of the counterflow arrangement of the air and the progressive differences in temperature of the two air streams is gained. Thus an arrangement is provided in which most the parts serve double and triple functions and yet operate with full efficiency in all respects. A structure of superior protection from damage by exterior stress is provided with maximum thermal efficiency.

While the embodiment of the present invention as herein disclosed, constitutes a preferred form, it is to be understood that other forms might be adopted.

What is claimed is as follows:

1. A thermoelectric array including a group of thermoelectric elements, a metal conductor connected to and extending in opposite directions from each of said group of thermoelectric elements, substantially parallel perforated sheets of electrical insulating material located on said conductors on opposite sides of said thermoelectric elements with each conductor extending through one of the perforations of one of the sheets, transverse substantially parallel metal fins each bridging only two adjacent conductors located on the outer sides of said sheets arranged to connect all the thermoelectric elements of the group in an electric series circuit arrangement.

2. A thermoelectric array according to claim 1 in which additional perforated sheets of electrical insulating material are provided at the outer ends of the metal conductors with a metal conductor extending through each of the perforations and provided with a head on the outer face of the adjacent additional sheet.

3. A thermoelectric array including a group of thermoelectric elements, a metal conductor extending in one direction from each of said group of thermoelectric elements, a first perforated sheet of electrical insulating material extending transversely to said conductors with each conductor passing through one of the perforations, a second perforated sheet of electrical insulating material substantially parallel to the first sheet located at the outer ends of said metal conductors, each of said metal conductors having a reduced end portion extending through one of the perforations of said second sheet and having a head on the outer face of said second sheet.

4. A thermoelectric array including a group of thermoelectric elements, a metal conductor extending in one direction from each of said group of thermoelectric elements, a first perforated sheet of electrical insulating material extending transversely to said conductors with each conductor passing through one of the perforations, and a second sheet of electrical insulating material fastened to the outer ends of said metal conductors.

5. A thermoelectric array including a group of thermoelectric elements arranged in more than two rows with more than two thermoelectric elements in each row, a metal conductor connected to and extending in opposite directions from each of said thermoelectric elements of said group, substantially parallel perforated sheets of electrical insulating material located on said conductors on opposite sides of said thermoelectric elements with each conductor extending through one of the perforations in one of the sheets, transverse substantially parallel metal fins each bridging only two adjacent conductors having fins extending transversely of said rows at one end on one side of said group and having the remaining fins on said one side extending parallel to said rows and having on the opposite side fins extending transversely of said rows at opposite ends and parallel to said rows in between said ends to connect said thermoelectric elements in series circuit.

6. A thermoelectric array according to claim 1 having electrical and heat foam insulating material cast around said thermoelectric elements in between said parallel perforated sheets.

7. A thermoeletric array according to claim 5 having additional parallel perforated sheets of electrical insulating material fastened to the outer ends of said metal conductors.

8. A thermoelectric array according to claim 1 having means for circulating two separate streams of gas in counterflow arrangement separately in heat transfer with the fins and conductors on opposite sides of said group of thermoelectric elements.

References Cited by the Examiner

UNITED STATES PATENTS

| | | | |
|---|---|---|---|
| 2,949,014 | 8/60 | Belton | 62—3 |
| 2,970,450 | 2/61 | Roeder | 62—3 |
| 2,973,627 | 3/61 | Lackey | 62—3 |
| 3,052,100 | 9/62 | Homkes | 62—3 |
| 3,138,934 | 6/64 | Roane | 62—3 |

WILLIAM J. WYE, *Primary Examiner.*

ROBERT A. O'LEARY, *Examiner.*